(12) United States Patent
Hashiguchi (10) Patent No.: US 6,917,413 B2
(45) Date of Patent: Jul. 12, 2005

(54) PERFORATION AND IMAGE EXPOSURE SYSTEM

(75) Inventor: Akihiro Hashiguchi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/807,293

(22) Filed: Mar. 24, 2004

(65) Prior Publication Data

US 2004/0189974 A1 Sep. 30, 2004

(30) Foreign Application Priority Data

Mar. 25, 2003 (JP) .......................................... 2003-083370

(51) Int. Cl.$^7$ ............................................. G03B 27/04
(52) U.S. Cl. ............................. 355/85; 355/40; 355/86; 101/415.1; 101/463.1; 101/477
(58) Field of Search ............................. 355/40, 85, 86; 101/415.1, 463.1, 477

(56) References Cited

U.S. PATENT DOCUMENTS

| | | | | |
|---|---|---|---|---|
| 5,255,607 A | * | 10/1993 | Nishiyama et al. | 101/463.1 |
| 5,390,001 A | * | 2/1995 | Ishiwata et al. | 355/85 |
| 6,170,396 B1 | * | 1/2001 | Naniwa et al. | 101/382.1 |
| 6,474,236 B1 | * | 11/2002 | Naniwa et al. | 101/477 |
| 6,766,742 B2 | * | 7/2004 | Hashiguchi | 101/477 |
| 2005/0028699 A1 | * | 2/2005 | Kan et al. | 101/477 |

FOREIGN PATENT DOCUMENTS

| | | |
|---|---|---|
| JP | 2001-356489 A | 12/2001 |
| JP | 2003-95489 A | 4/2003 |

* cited by examiner

*Primary Examiner*—D. Rutledge
(74) *Attorney, Agent, or Firm*—Sughrue Mion, PLLC (57) ABSTRACT

A perforation and image exposure system comprises an image exposure apparatus and a punch unit. The image exposure apparatus has a first reference pin for defining a lateral position of a plate through contacting with one side edge of the plate contacting a pair of first positioning pins, and image exposure means for exposing the image into the plate subjected to positioning by the pair of first positioning pins and the first reference pin. The punch unit has a second reference pin for defining a lateral position of the plate through contacting with one side edge of the plate contacting a pair of second positioning pins, and perforation means for forming punched holes for positioning on the plate subjected to positioning by the pair of second positioning pins and the second reference pin. The image exposure apparatus and the punch unit keep relative positions of three pins of the pair of first positioning pins and the first reference pin and relative positions of three pins of the pair of second positioning pins and the second reference pin at same positions.

7 Claims, 10 Drawing Sheets

PERFORATION AND IMAGE EXPOSURE SYSTEM

BACKGROUND OF THE INVENTION

1. Field of the Invention

The present invention relates to a perforation and image exposure system in which a hole is punched in a plate and an image is exposed.

2. Description of the Related Art

Hitherto, as an image exposure apparatus for creating a printing plate in which an image is exposed on a plate such as an aluminum foil sheet, there is known one in which the plate is wound around a rotating drum, and the plate is irradiated with a light beam according to image data, while the plate is rotated together with the rotating drum, so that the plate is exposed on a scanning basis (cf. for example, Japanese Patent Application Laid Open Gazette TokuKai. 2001-356489 (Page 1, FIG. 2).

By the way, there is known a method in which a punched hole, as a criterion when a plate (the printing plate) after image exposure is wound around a rotary press to perform printing, is formed on the plate before or after the image exposure. There is also known one in which a punch unit for formed such a punched hole is prepared independently of an image exposure apparatus, and the image exposure apparatus is provided with only an exposure function. In case of the use of such a type of structure, there is a need that the image exposure apparatus is used to perform image exposure onto the plate, and the punch unit separated from the image exposure apparatus is used to form a punched hole (the procedure for the image exposure and the punched hole formation is optional).

As mentioned above, in case of the use of an apparatus of an arrangement in which the punch unit is independently separated from the image exposure apparatus, an image exposure process and a punch process are carried out independently of one another. This makes it easy to bring about discrepancy between the exposure position of the plate and the punch position. Discrepancy between the exposure position of the plate and the punch position causes discrepancy between the image exposure position and the printing position using a printing plate. Accordingly, there is a need to implement an exact coincidence between the exposure position of the plate and the punch position.

According to the conventional apparatus as mentioned above, as a method of plate positioning, there is adopted a method of performing positioning in such a way that a puncher is used to form a notch for positioning at the top of the plate, and the notch is engaged with a positioning pin projecting into the rotating drum or a positioning pin provided on the punch unit.

Further, as another method of plate positioning different from the above, there is known a technology of performing plate positioning in such a way that a mark referred to as a "register mark" is applied by an exposure to a place out of the image area of the plate, and the mark is measured to move the plate in accordance with the mark.

The method of forming a notch by a puncher according to the prior art needs an expensive puncher for forming the notch, and in addition needs frequent exchange of blades to form notches on a large number of plates. Accordingly, these aspects involve the cost up.

Further, the method of applying the mark to the plate needs a measurement apparatus for measuring marks for the image exposure apparatus and the punch unit. This aspect also involves the cost up, and in addition involves such a problem that the processing procedure is restricted, since the marks are formed by exposure, and as a result, the exposure step is first and the punch step is later.

SUMMARY OF THE INVENTION

In view of the foregoing, it is an object of the present invention to provide a perforation and image exposure system in which an image exposure apparatus and a punch unit are arranged independently of one another, capable of performing a plate positioning with great accuracy and with inexpensive system.

To achieve the above-mentioned object, the present invention provides a perforation and image exposure system comprising an image exposure apparatus for exposing an image into a plate, and a punch unit for forming on the plate punched holes for positioning, the perforation and image exposure system forming the plate having the punched holes for positioning and being exposed in the image, wherein the image exposure apparatus comprises:

a pair of first positioning pins which are in contact with a front edge of the plate;

a first reference pin for defining a lateral position of the plate through contacting with one side edge of the plate contacting the pair of first positioning pins; and image exposure means for exposing the image into the plate subjected to positioning by the pair of first positioning pins and the first reference pin, wherein the punch unit comprises:

a pair of second positioning pins which are in contact with the front edge of the plate;

a second reference pin for defining a lateral position of the plate through contacting with one side edge of the plate contacting the pair of second positioning pins; and perforation means for forming punched holes for positioning on the plate subjected to positioning by the pair of second positioning pins and the second reference pin, and wherein when the image exposure apparatus and the punch unit perform positioning for the same plate, the image exposure apparatus and the punch unit keep relative positions of three pins of the pair of first positioning pins and the first reference pin and relative positions of three pins of the pair of second positioning pins and the second reference pin at same positions.

This feature makes it possible to perform positioning of plates with great accuracy in an image exposure apparatus and a punch unit with inexpensive means by the three-point positioning.

In the perforation and image exposure system according to the present invention as mentioned above, it is preferable that the first reference pin and the second reference pin are movable in a same direction as a direction coupling the pair of first positioning pins with one another and in a same direction as a direction coupling the pair of second positioning pins with one another, respectively, and wherein when the image exposure apparatus and the punch unit perform positioning for the same plate, the image exposure apparatus and the punch unit further comprise first reference pin position control means and second reference pin position control means, respectively, the first reference pin position control means and the second reference pin position control means moving the first reference pin and the second reference pin to positions in which relative positions of the first reference pin and the second reference pin to the pair of first positioning pins and the pair of second positioning pins are same, respectively.

In the perforation and image exposure system according to the present invention as mentioned above, it is preferable that one of the image exposure apparatus and the punch unit has information input means for entering size information of the plate, and information transmitting means for transmitting information entered from the information input means to another apparatus or unit, and the another apparatus or unit has information receiving means for receiving information transmitted from the one apparatus or unit, the reference pin position control means provided on the one apparatus or unit controls a position of the reference pin provided on the one apparatus or unit in accordance with the information entered from the information input means, and the reference pin position control means provided on the another apparatus or unit controls a position of the reference pin provided on the another apparatus or unit in accordance with the size information of the plate received by the information receiving means.

In the perforation and image exposure system according to the present invention as mentioned above, it is preferable that the one apparatus or unit is the image exposure apparatus, the information input means enters punch type information as well as the size information, and the perforation means forms the punched holes in accordance with the punch type information received by the information receiving means.

In the perforation and image exposure system according to the present invention as mentioned above, it is preferable that the punch unit has punch type input means for entering punch type information, and the perforation means forms the punched holes in accordance with the punch type information entered from the punch type input means.

In the a perforation and image exposure system according to the present invention as mentioned above, it is preferable that the image exposure apparatus has a plate guide unit, which incorporates therein a plate feed roller for conveying the plate to the first positioning pins by means of rotating while a lower surface of the plate is supported, the plate feed roller rotating below the plate at a position in which a front edge of the plate is in contact with the first positioning pins, the first reference pin, and a width direction moving unit having an urging pin urging the plate to the first reference pin through conveying the plate to the first reference pin.

In the perforation and image exposure system according to the present invention as mentioned above, it is preferable that the image exposure apparatus has a rotating drum around which the plate is wound, and an exposure head for exposing an image into the plate wound around the rotating drum, and the first positioning pins are provided on a peripheral surface of the rotating drum.

DETAILED DESCRIPTION OF PREFERRED EMBODIMENTS

Embodiments of the present invention will be described with reference to the accompanying drawings.

Figure 1:
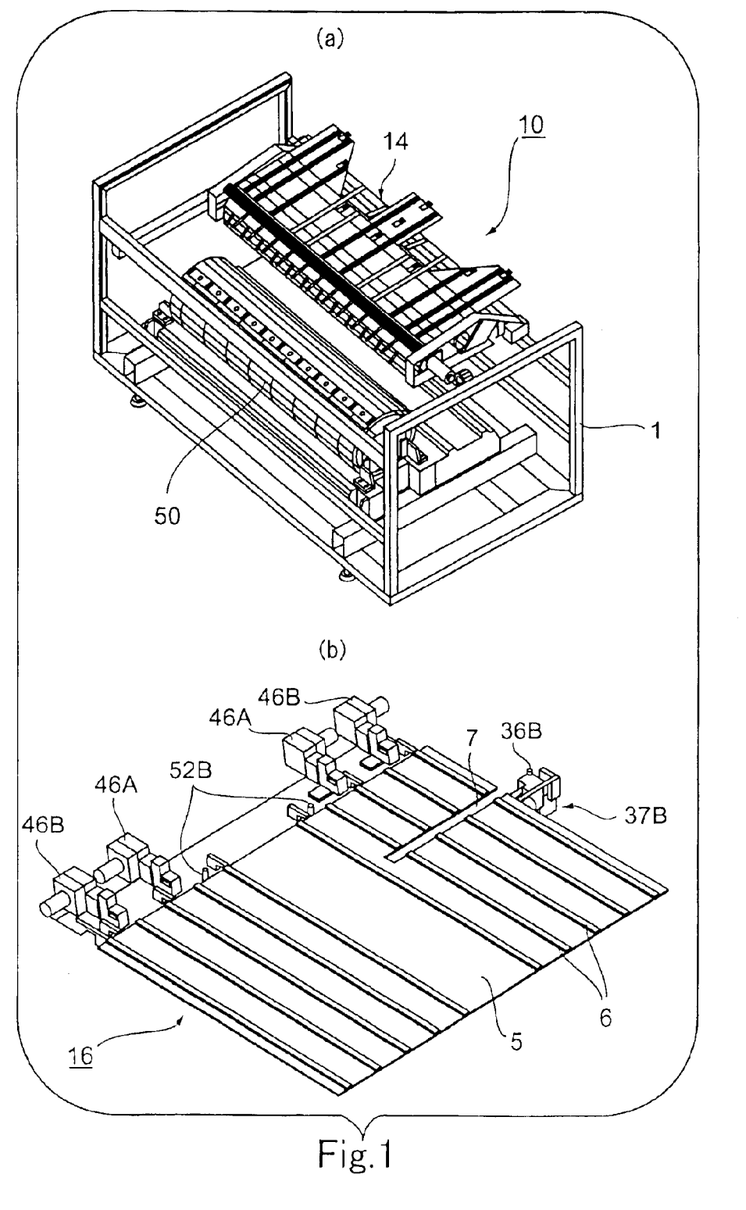
FIG. 1 is a perspective view of a perforation and image exposure system according to an embodiment of the present invention. A part (a) of FIG. 1 shows an image exposure apparatus. A part (b) of FIG. 1 shows a punch unit.

FIG. 1 is a perspective view of a perforation and image exposure system according to an embodiment of the present invention. A part (a) of FIG. 1 shows an image exposure apparatus. A part (b) of FIG. 1 shows a punch unit.

First, there will be explained an image exposure apparatus of the part (a) of FIG. 1. An image exposure apparatus 10 comprises a rotating drum 50 mounted on a frame 1, and a conveying guide unit 14 disposed upward the rotating drum 50.

Figure 2:
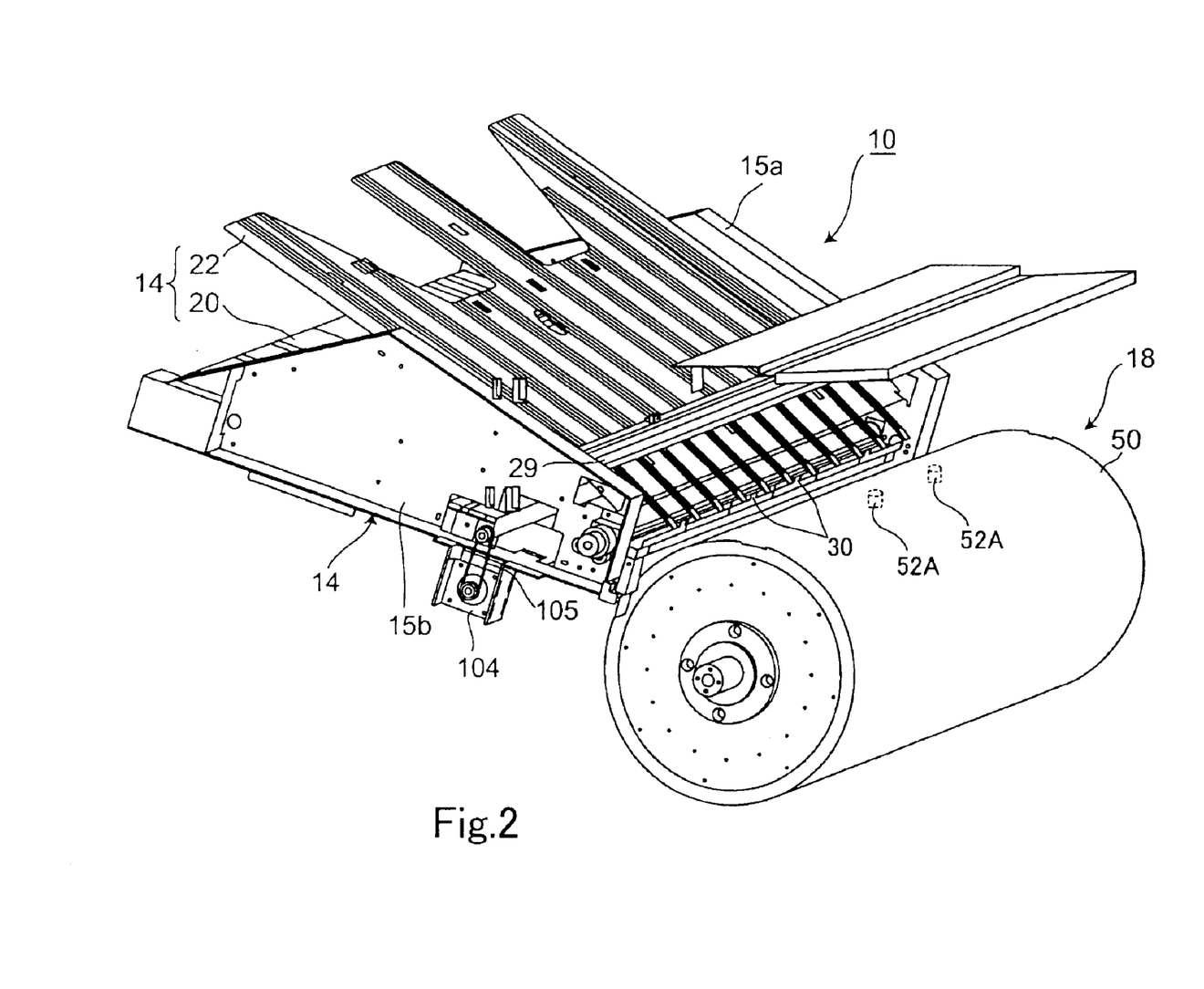
FIG. 2 is a perspective view of a conveying guide unit of an image exposure apparatus according to an embodiment of the present invention.
Figure 3:
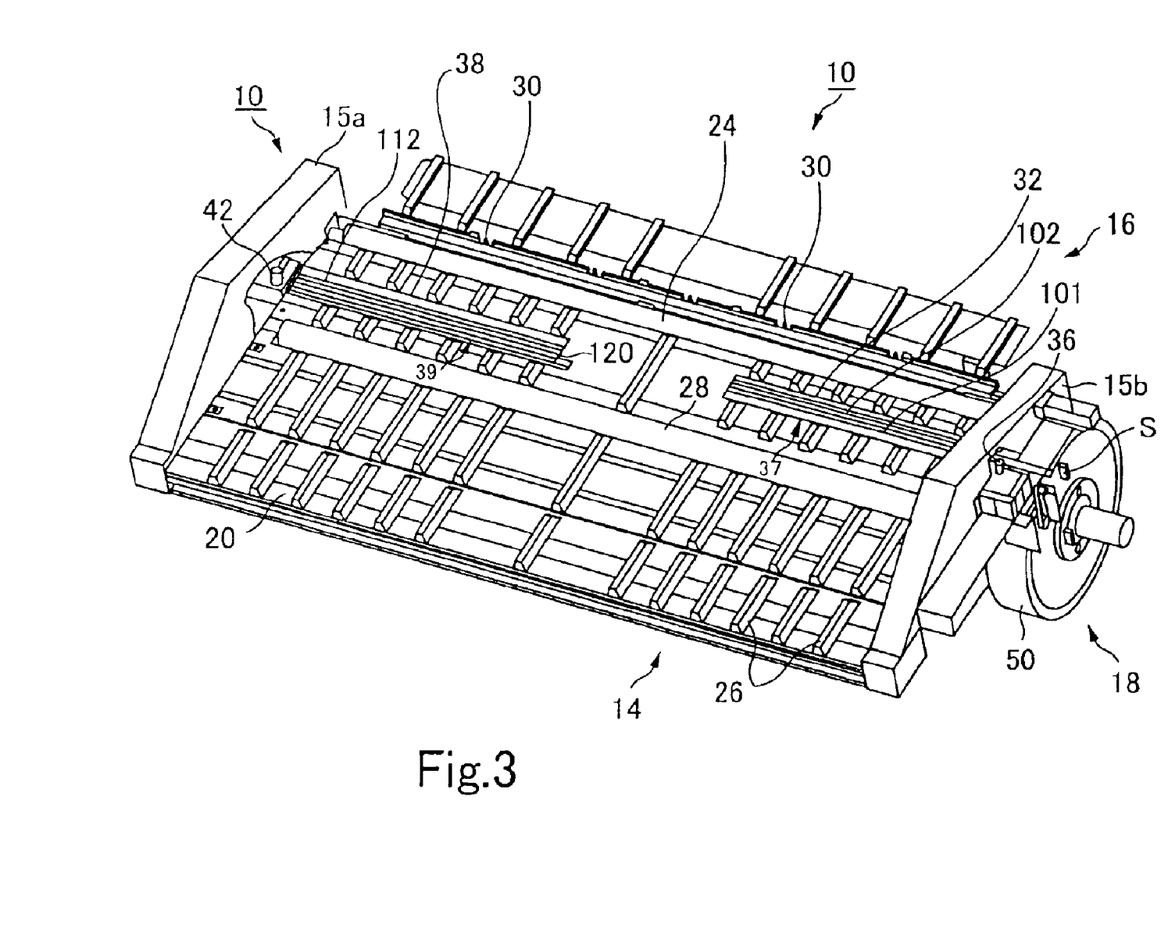
FIG. 3 is a perspective view of a conveying guide unit wherein a plate delivery guide is removed.
Figure 4:
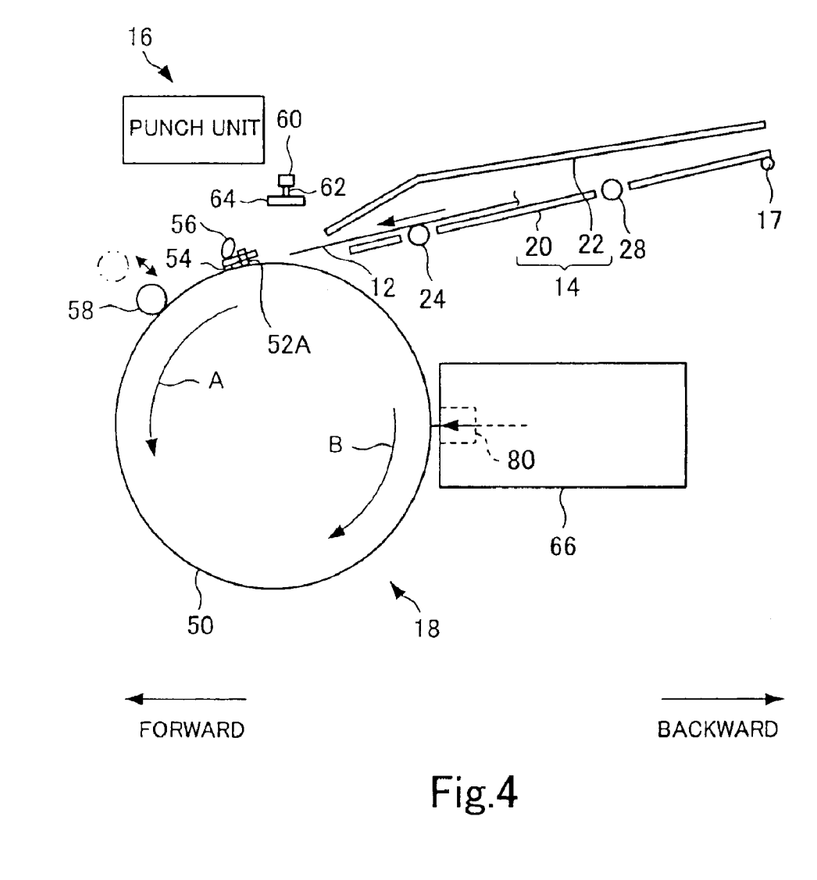
FIG. 4 is a schematic side view of an image exposure apparatus according to an embodiment of the present invention.

FIG. 2 is a perspective view of a conveying guide unit 14 of the image exposure apparatus 50. FIG. 3 is a perspective view of the conveying guide unit wherein a plate delivery guide is removed. FIG. 4 is a schematic side view of the image exposure apparatus.

The conveying guide unit 14 comprises a plate feed guide unit 20 shaped as an approximately quadrilateral plate, a plate delivery guide unit 22 shaped as approximately quadrilateral plate, which is disposed on the upper portion of the plate feed guide 20, and left frame 15a and right frame 15b provided at both sides.

As shown in FIG. 3, at the front portion of the plate feed guide unit 20, there are provided cylindrical front plate feed roller 24 and back plate feed roller 28 in such a manner that they are rotatable and project onto the plate feed guide unit 20. When the front plate feed roller 24 and back plate feed roller 28 are rotated forward and reversely by a driving motor (not illustrated), the plate 12 put on the plate feed guide unit 20 is conveyed forward or backward. As shown in FIG. 2, at the front portion of the plate delivery guide unit 22, there is provided a cylindrical plate delivery roller unit 29 in such a manner that the roller 29 is rotatable and projects onto the plate delivery guide unit 22. When the plate delivery roller 29 is rotated by a driving motor (not illustrated), the plate 12 put on the plate delivery guide unit 22 is conveyed backward.

As shown in FIG. 3, on the plate feed guide unit 20, there are provided a large number of trapezoidal columnar ribs 26. Those ribs 26 are disposed in parallel with respect to the lateral direction, and is set up in such a manner that height of the rib in projection onto the plate feed guide 20 is slightly lower than the front plate feed roller 24. The use of the ribs 26 contributes to reduction of the frictional force involved in conveyance of the plate 12 by rotation of the plate feed roller 28.

At the front of the plate feed guide 20, there is provided a preset member 30 used for provisional positioning of the plate 12. The preset member 30 is advanced to the front edge of the plate 12 or is withdrawn from the plate feed guide unit 20.

When the plate feed roller 24 conveys the plate 12 forward, the front edge of the plate 12 bumps against the preset member 30. Thus, a positioning of the front edge of the plate 12 is carried out. When the preset member 30 is withdrawn downward, it is possible that the plate feed roller 24 causes the plate 12 to be conveyed forward over the front edge of the plate feed guide unit 20.

As shown in FIG. 3, at the right side of the plate feed guide unit 20, there is formed a slit 32, which is substantially parallel with the plate feed rollers 24 and 28 in the vicinity of the rear side of the plate feed roller 24. Below the slit 32, there is disposed a first reference pin moving unit 37A in parallel with the slit 32.

Figure 5:
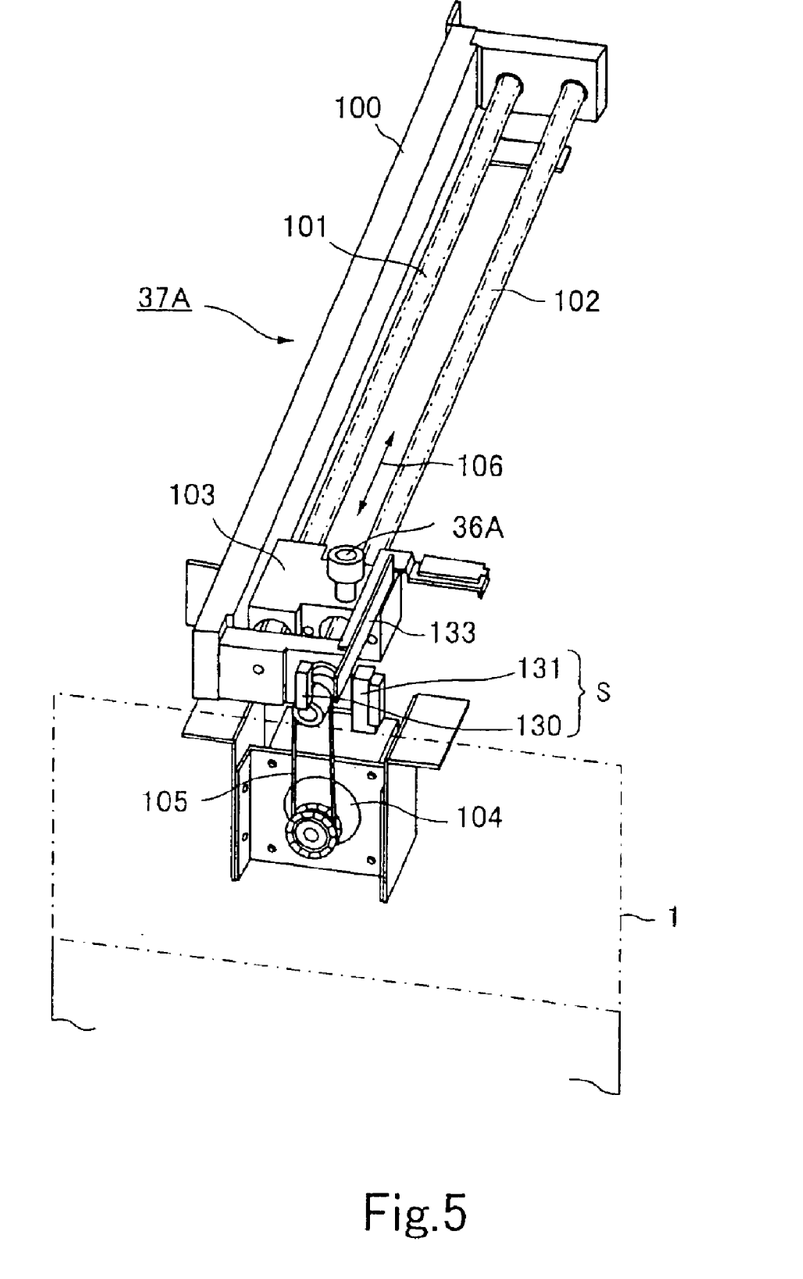
FIG. 5 is a perspective view of a reference pin moving unit.

FIG. 5 is a perspective view of the first reference pin moving unit 37A. As shown in FIG. 5, the first reference pin moving unit 37A comprises a guide member 101 fixed on a frame 100, and a feed screw 102 rotatably mounted on the frame 100, the feed screw 102 being in parallel to the guide member 101. A moving member 103 is slidably mounted on the guide member 101 and is screwed to the feed screw 102. A first reference pin 36A is rotatably mounted on the top of the moving member 103 and is formed as a roller. The feed screw 102 is driven by a driving motor 104 installed in the frame 100 via a timing belt 105, so that the moving member 103 reciprocates in an arrow 106 and the first reference pin 36A reciprocates projecting from the slit 32.

The first reference pin 36A is located at a home position of the right end of the plate feed guide unit 20 beforehand, that is, a detecting position of a home position sensor S. A criterion of the right end of the plate 12 is determined in such a manner that the first reference pin 36A moves from the home position to the left in accordance with a size of the plate 12 put on the plate feed guide unit 20.

A detection bracket 133 extending substantially horizontally is mounted on the moving member 103 of the reference pin moving unit 37A. When the detection bracket 133 enters between a light-emitting device 130 and a photo-electric element 131, the photo-electric element 131 turns on to detect the home position of the first reference pin 36A as will be described later.

As shown in FIG. 2, at the left side of the plate feed guide unit 20, there is formed a slit 38 substantially in parallel to the front plate feed roller 24 and the back plate feed roller 28. Below the slit 38, there is disposed a width direction moving unit 39 in parallel to the slit 38.

Figure 6:
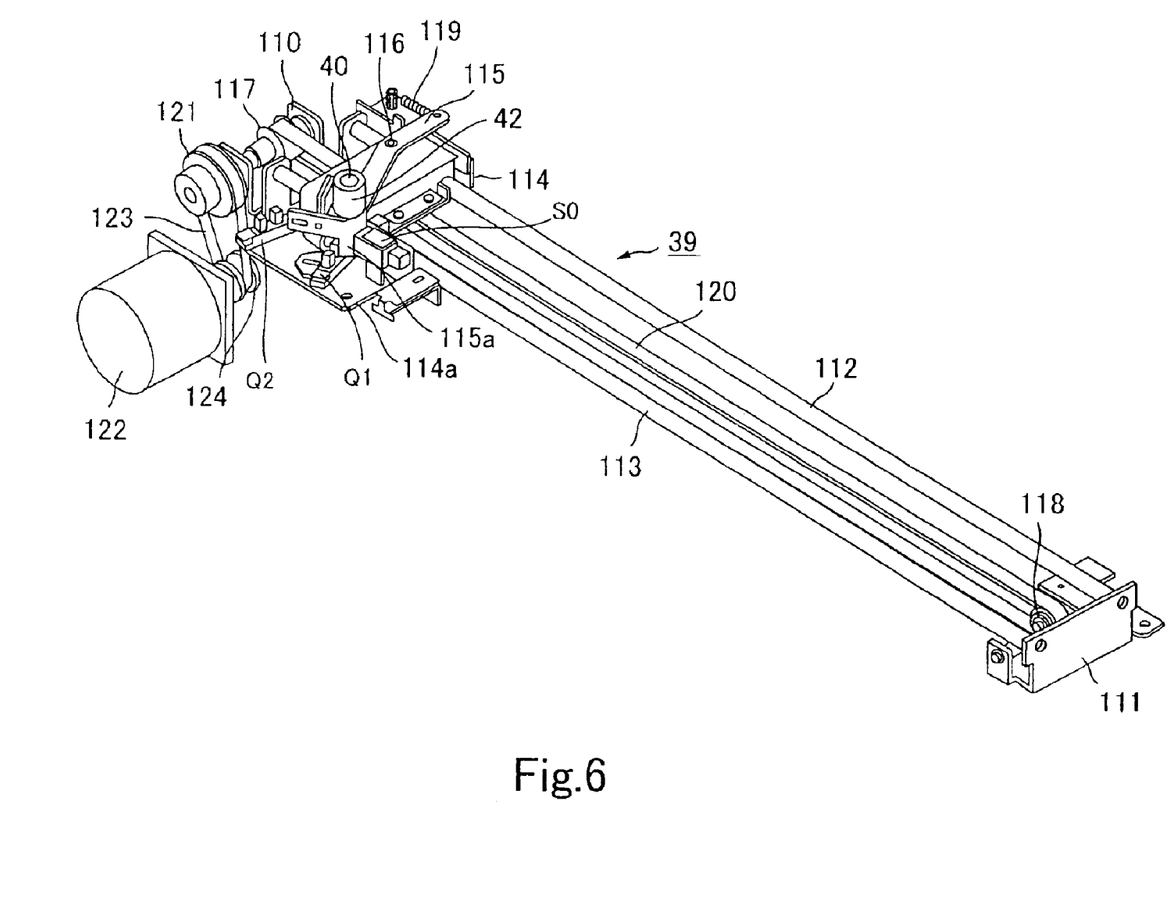
FIG. 6 is a perspective view of a width direction moving unit.

FIG. 6 is a perspective view of the width direction moving unit 39.

The width direction moving unit 39 comprises guide members 112 and 113 fixed between frames 110 and 111, and a moving member 114 which is movably mounted on the guide members 112 and 113. At the upper portion of the moving member 114, a rotatably moving lever 115 is rotatably mounted on a fulcrum 116. A columnar urging pin 42 is rotatably supported on a support shaft 40 of the rotatably moving lever 115. The urging pin 42 projects from the slit 38. A pressurizing spring 119 enables the rotatably moving lever 115 anticlockwise in FIG. 6, that is, in a direction that the urging pin 42 moves forward.

A timing belt 120 is built between pulleys 117 and 118 provided on the frames 110 and 111, respectively. The moving member 114 is fixed on the timing belt 120. A driving pulley 121 is installed in a shaft of the pulley 117 provided on the frame 111. A timing belt 123 is built between the driving pulley 121 and a motor pulley 124 of a driving motor 122 mounted on the frame 110.

As shown in FIG. 4, the exposure section 18 is provided with the columnar rotating drum 50 and an exposure head 66. The plate feed guide unit 20 faces a tangential direction of the rotating drum 50, and the plate 12 on the plate feed guide unit 20 is subjected to the provisional positioning. Thereafter, the preset member 30 goes down from the upper surface of the plate feed guide unit 20. In this condition, the plate 12 is conveyed by the plate feed roller 24 so that the front edge of the plate 12 is located at the peripheral surface of the rotating drum 50.

At the peripheral surface of the rotating drum 50, there is provided at least pair of first positioning pins 52A. Further, in the vicinity of the respective first positioning pin 52A on the peripheral surface of the rotating drum 50, there is provided a front edge chuck 54. Upper the front edge chuck 54 there is provided a cam 56. When the cam 56 urges the front side of the front edge chuck 54, the rear side of the front edge chuck 54 separates from the peripheral surface of the rotating drum 50. Thus, the front edge of the plate 12 conveyed from the plate feed guide 20 to the peripheral surface of the rotating drum 50 is inserted between the rear side of the front edge chuck 54 and the peripheral surface of the rotating drum 50, and in this condition the regular positioning of the plate 12 is carried out.

After the regular positioning of the plate 12 is carried out, the cam 56 rotatably moves to release the depression of the front edge chuck 54, so that the rear side of the front edge chuck 54 rotatably moves by a spring (not illustrated) provided inside the front edge chuck 54. Thus, the front edge of the plate 12 is urged and held on the peripheral surface of the rotating drum 50. When the front edge of the plate 12 is held on the peripheral surface of the rotating drum 50, the rotating drum 50 rotates in a plate supplying direction (the direction of the arrow A in FIG. 4), so that the plate 12 is wound around the peripheral surface of the rotating drum 50.

In the vicinity of the peripheral surface of the rotating drum 50, there is provided a squeeze roller 58, which is detachably from the rotating drum 50, in the side of the direction of the arrow A in FIG. 4 with respect to the mounting cam 56. When the squeeze roller 58 moves to the side of the rotating drum 50, the squeeze roller 58 urges the plate 12 to be wound around the rotating drum 50 toward the rotating drum 50 and rotates, so that the plate 12 is in closely contact with the peripheral surface of the rotating drum 50.

Further, in the vicinity of the peripheral surface of the rotating drum 50, there is provided a rear chuck detachable unit 60 in the side of the direction of the arrow B in FIG. 4 with respect to the mounting cam 56. The rear chuck detachable unit 60 has a shaft 62, which is movable to the rotating drum 50. A rear chuck 64 is mounted on the top of the shaft 62. When the rear edge of the plate 12 wound around the rotating drum 50 faces the rear chuck detachable unit 60, the shaft 62 causes the rear chuck 64 to move to the side of the rotating drum 50 so that the rear chuck 64 is mounted on a predetermined position of the rotating drum 50 and is separated from the shaft 62. Thus, the rear chuck 64 urges the rear edge of the plate 12, so that the rear edge of the plate 12 is held on the peripheral surface of the rotating drum 50.

In this manner, when the front edge and the rear edge of the plate 12 are held on the peripheral surface of the rotating drum 50 by the front edge chuck 54 and the rear chuck 64, the squeeze roller 58 is separated from the rotating drum 50, and the rotating drum 50 rotates at a predetermined rotating speed. Thus, the plate 12 is conveyed on the plate feed guide unit 20 and is wound around the rotating drum 50.

Figure 7:
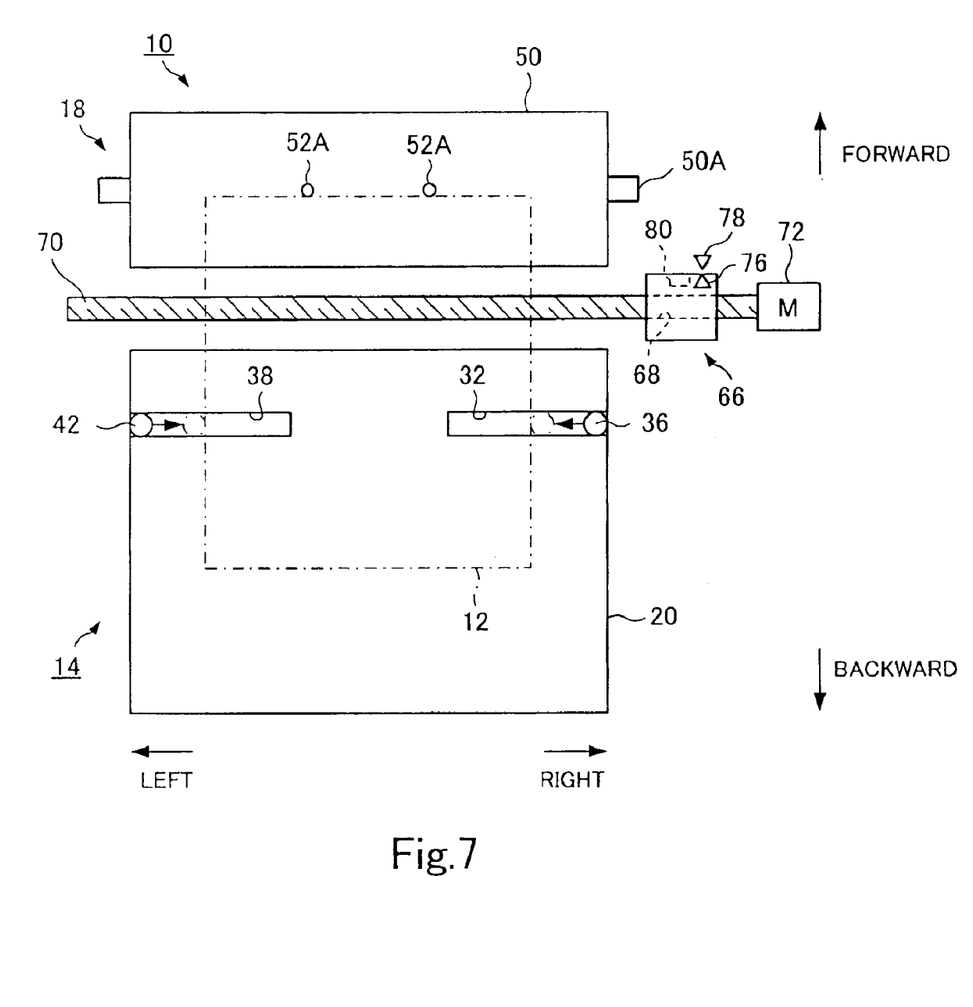
FIG. 7 is a plan view of essential portions of an image exposure apparatus according to an embodiment of the present invention.

As shown in FIG. 7, in the vicinity of the back of the peripheral surface of the rotating drum 50, there is disposed an exposure head 66 as an image exposure section 18. The exposure head 66 is provided with a female screw 68. In the vicinity of the back-of the periphery of the rotating drum 50, there is disposed a feed screw 70 in parallel to the direction of a shaft 50A of the rotating drum. One end (the right side in the present embodiment) of the feed screw 70 is coupled with a pulse motor 72 (a stepping motor), so that driving of the pulse motor 72 makes it possible that the feed screw 70 rotates. The female screw 68 of the exposure head 66 is engaged with the feed screw 70 on a spiral basis. When the feed screw 70 rotates by the drive of the pulse motor 72, the exposure head 66 moves in the shaft line direction of the rotating drum 50.

The exposure head 66 is provided with a head home position-detecting sensor 76. When the head home position-detecting sensor 76 detects a home position mark 78 which is disposed at a predetermined position in the vicinity of the rotating drum 50, the exposure head 66 is disposed on a head home position.

In the exposure head 66, a light beam, which is modulated in accordance with the read image data, is projected from an irradiation lens 80 to the rotating drum 50 to be rotated at high speed in synchronism with the rotation of the rotating drum 50, so that the plate 12 is exposed in accordance with the image data. This exposure processing is a so-called scanning exposure processing that while the rotating drum 50 is rotated at high speed (the main scanning), the exposure head 66 is moved to the shaft line direction of the rotating drum 50 (the sub-scanning).

When the scanning exposure to the plate 12 is terminated, the rotating drum 50 temporarily stops in its rotating operation at the position that the rear edge chuck 64 faces the shaft 62 to remove the rear edge chuck 64 from the rotating drum 50, so that the pressure to the rear edge of the plate 12 by the rear edge chuck 64 is released. Further, after the conveying guide unit 14 rotatably moves and the plate delivery guide 22 faces the tangential direction to the rotating drum 50 as shown with the solid line in FIG. 3, the rotating drum 50 rotates in the direction as indicated by the arrow B in FIG. 3. Thus, the plate 12 is delivered from the rear edge side to the plate delivery guide 22. At that time, the cam 56 rotatably moves to press the front side of the front edge chuck 54, so that the pressure to the front edge of the plate 12 by the back side of the front edge chuck 54 is released.

When the plate 12 is transmitted to the plate delivery guide 22, the plate delivery roller 29 rotatably moves to deliver the plate 12 from the plate delivery guide 22, so that the plate 12 is conveyed to a developing unit or a printing unit (not illustrated) involved in the subsequent step adjacent to the image exposure apparatus 10.

Next, there will be explained a punch unit in the part (b) of FIG. 1. A punch unit 16 comprises a guide plate 5, on which the plate 12 is put, and a pair of first punchers 46A and a pair of second punchers 46B, which are provided at the front edge portion of the guide plate 5. On a surface of the guide plate 5, there are provided sliding members 6 shaped as a rib directed to the conveying direction of the plate 12.

A puncher comprises, by way of example, the first punchers 46A for forming relatively narrower punched holes and the second punchers 46B for forming relatively wider punched holes, which are provided outside. As the type of the puncher, it is possible to optionally select a desired one in accordance with intervals, geometry and sizes of punched holes to be formed.

There is provided a pair of second positioning pins 52B located at the front edge of the guide plate 5 in an inside direction. An interval of the second positioning pins 52B is equal to that of the pair of first positioning pins 52A.

In the right side of the guide plate 5, there is formed a slit 7 substantially in a parallel to a line coupling the pair of second positioning pins 52B with one another. Below the slit 7, there is disposed a second reference pin moving unit 37B in parallel with the slit 7. The second reference pin moving unit 37B is the same as the first reference pin moving unit 37A shown in FIG. 6 in structure, and is provided with a second reference pin 36B which is the same as the first reference pin 36A.

Figure 8:
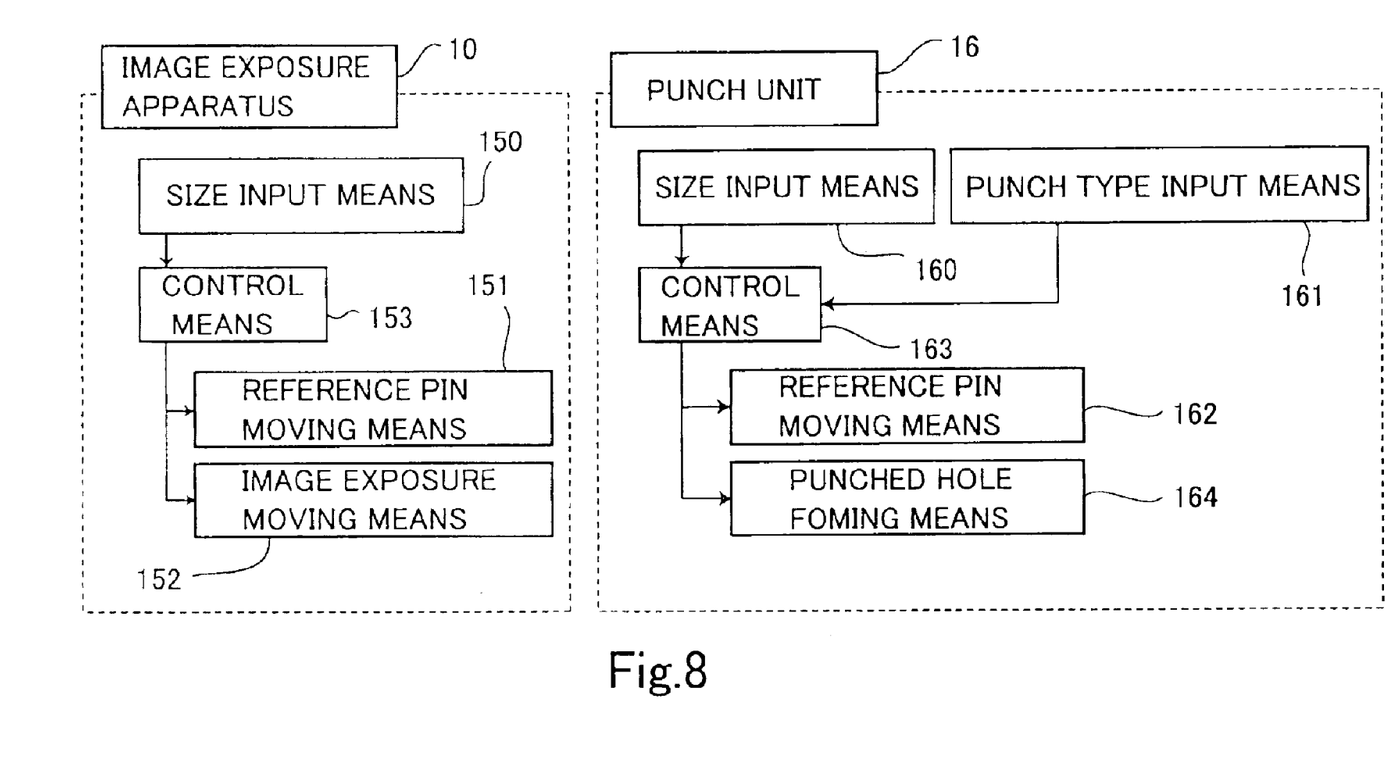
FIG. 8 is a block diagram showing a first embodiment of a perforation and image exposure system of the present invention.

FIG. 8 is a block diagram showing a first embodiment of a perforation and image exposure system of the present invention.

FIG. 8 shows control circuits for the image exposure apparatus 10 and the punch unit 16.

With respect to the image exposure apparatus 10, connected to control means 153 are size input means 150, for example, keys for entering a plate size, reference pin moving means 151 as a driving circuit for the driving motor 104 for moving the-reference pin 36, and image exposure moving means 152 for moving the exposure head 66. Migration length of the reference pin 36 and the movement of the image exposure moving means 152 are controlled in accordance with an input of the plate size from the size input means 150. Any one is acceptable, as the size input means 150, which enters the plate size by numeral values, or enters a desired number wherein there is prepared a table storing plate sizes, punch types and so on associated with predetermined numbers. Further, it is acceptable that size information and the like is recorded in a place other than the image exposure area for the plate in form of bar codes and the like, and are entered to the control means 153 through reading the size information by a reader section (not illustrated).

With respect to the punch unit 16, connected to control means 163 are size input means 160, for example, keys for entering a plate size, punch type input means 161 for entering punch types (either one of the first puncher 46A and the second puncher 46B), reference pin moving means 162 for moving the reference pin 36B, and punched hole forming means 164 (punchers 46A and 46B) for driving the punch unit. Migration length of the reference pin 36B and the punched hole forming means 164 are controlled in accordance with an input of the plate size from the size input means 160 and an input of the punch type input means 161.

The system shown in FIG. 8 is an offline system in which the image exposure apparatus 10 is independent of the punch unit 16. The size information is entered through the size input means 150 and 160 individually to control the reference pins 36A and 36B.

Figure 9:
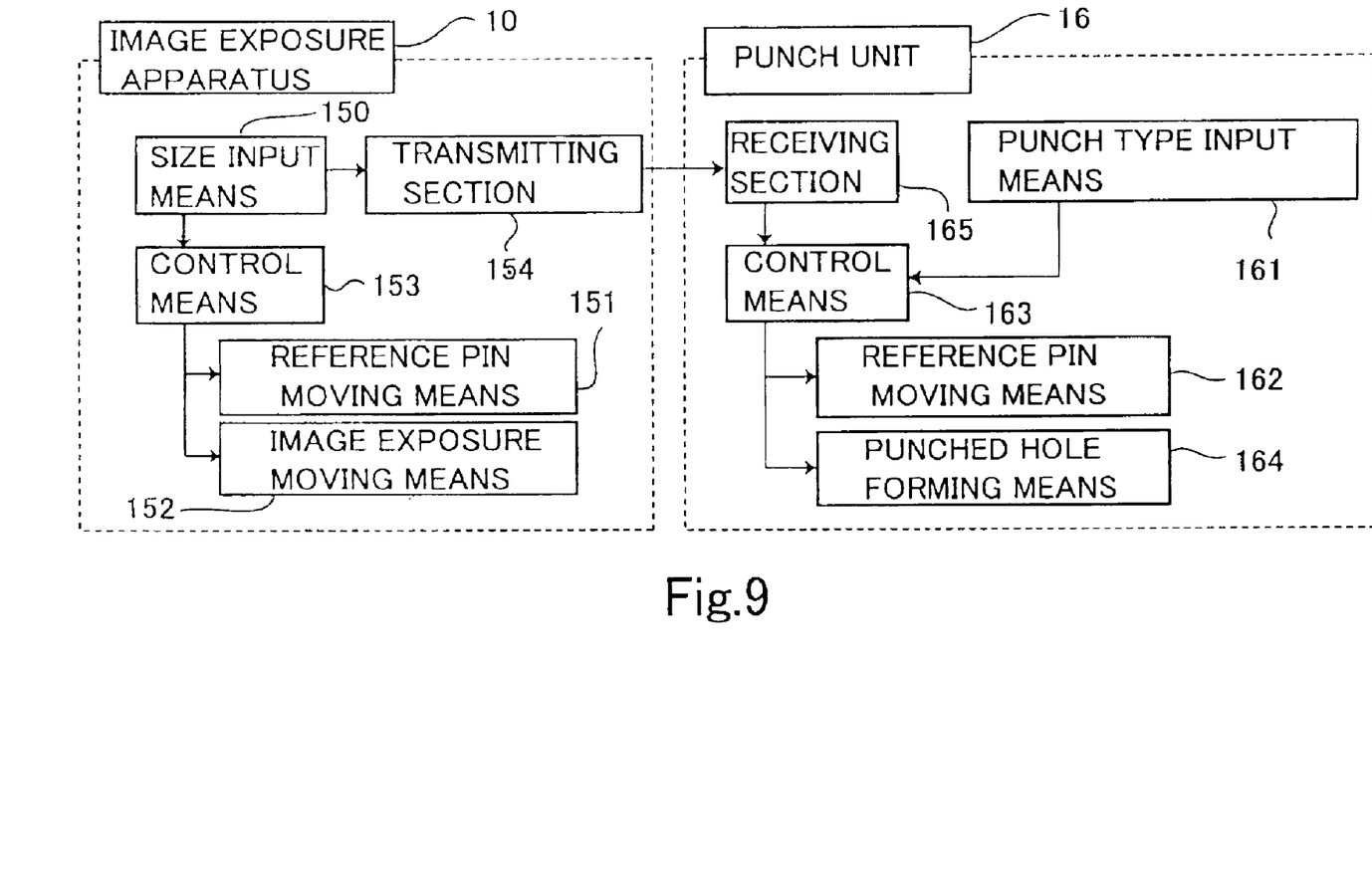
FIG. 9 is a block diagram showing a second embodiment of a perforation and image exposure system of the present invention.
Figure 10:
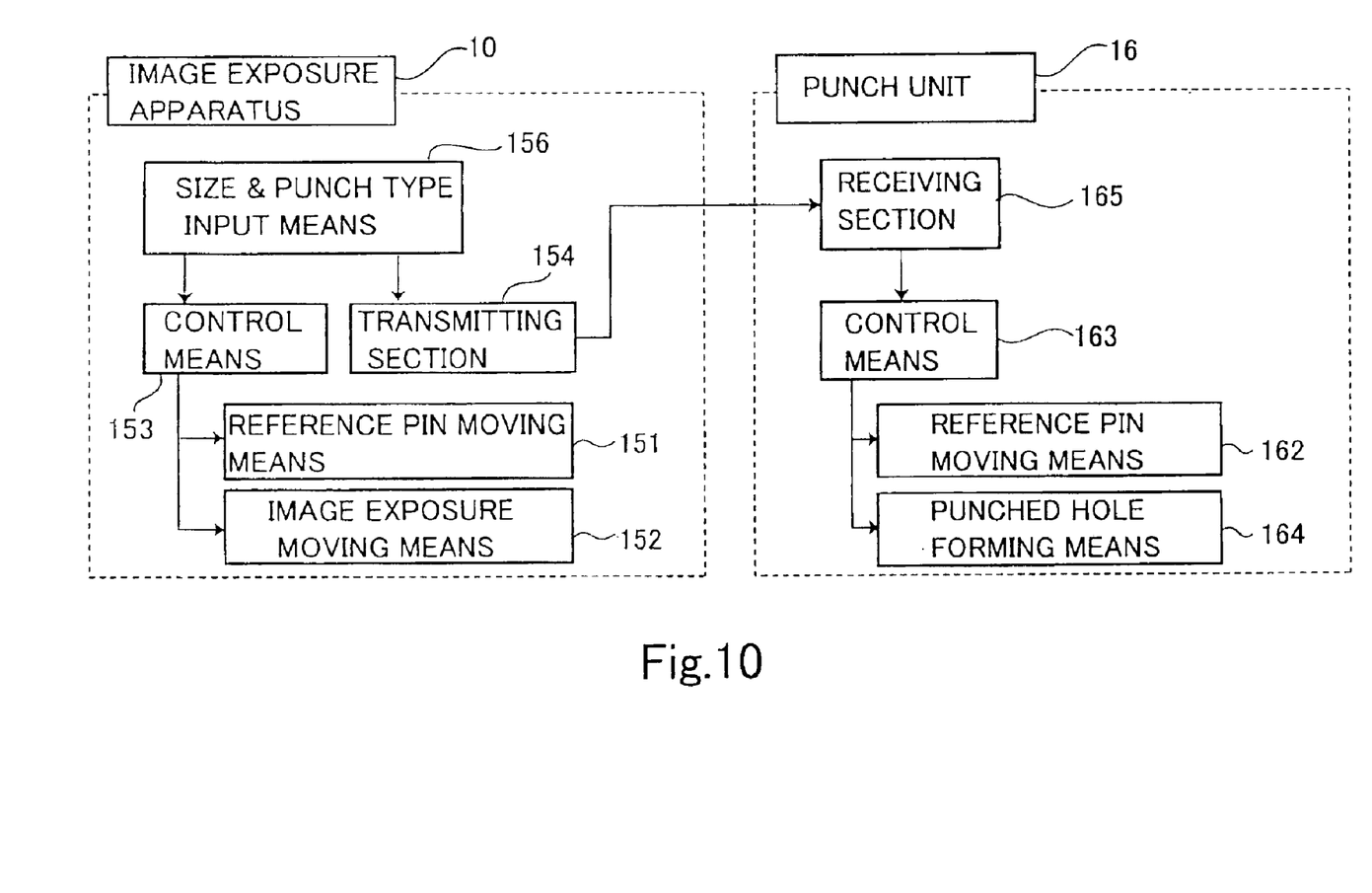
FIG. 10 is a block diagram showing a third embodiment of a perforation and image exposure system of the present invention.

FIG. 9 is a block diagram showing a second embodiment of a perforation and image exposure system of the present invention. FIG. 10 is a block diagram showing a third embodiment of a perforation and image exposure system of the present invention.

FIG. 9 and FIG. 10 shows systems in which the image exposure apparatus 10 is coupled with the punch unit 16 via an on-line.

In the system of FIG. 9, the structure of the image exposure apparatus 10 is the same as that of FIG. 8, and the structure of the punch unit 16 is the same as that of FIG. 8 excepting that the size input means 160 is removed. Size information from the size input means 150 of the image exposure apparatus 10 is transmitted from a transmitting section 154 to a receiving section 165 of the punch unit 16. The size information is fed from the receiving section 165 to the control means 163. Upon receipt of the size information, the control means 163 controls migration length of the second reference pin 36B and the punched hole forming means 164 in accordance with the size information.

In the system of FIG. 10, the image exposure apparatus 10 includes size and punch type input means 156 for entering plate sizes and punch types (usually, a punch type is automatically determined in accordance with a plate size). In the punch unit 16, the size input means 160 shown in FIG. 8 and the input of the punch type input means 161 shown in FIG. 8 and FIG. 9 are removed. Size and punch type information from the size and punch type input means 156 of the image exposure apparatus 10 is fed via the transmitting section 154 and the receiving section 165 to the control means 163 of the punch unit 16. Migration length of the reference pin 36B and the punched hole forming means 164 are controlled in accordance with the size and punch type information from the size and punch type input means 156.

According to the systems shown in FIGS. 9 and 10, while the size information or the size and punch type information is transmitted from the image exposure apparatus 10 to the punch unit 16, it is acceptable that those types of information are transmitted from the punch unit 16 to the image exposure apparatus 10. In this case, after the punched hole is formed on the plate 12, the plate 12 is exposed in the image exposure apparatus 10.

Next, there will be explained an operation of positioning of a plate in the image exposure apparatus 10.

First, size information, such as length, width and thickness of the plate 12, is inputted by the size input means 150 into control means 153, and then the plate 12 is put on the plate feed guide 20. At that time, any one is acceptable, as a plate feed scheme, which is concerned with a manual insertion or an automatic feed. The plate 12 on the plate feed guide 20 is put in a relatively rough state.

In this condition, the plate feed rollers 24 and 28 conveys the plate 12 forward, so that the front edge of the plate 12 bumps against the preset member 30. At that time, the plate feed rollers 24 and 28 rotate and slip with the plate 12.

In this condition, the first reference pin 36A moves by the migration length that is computed from width size information for the plate 12 in accordance with signals from the control means 153. More in details, the driving motor 104 of the first reference pin moving unit 37A shown in FIG. 5 is driven by the width size information for the plate 12 is driven so that the reference pin 36A and the detection bracket 133 enter via the timing belt 105, the feed screw 102 and the moving member 103 between the light-emitting device 130 of the upper home position sensor S1 and the photo-electric element 131, and the photo-electric element 131 turns on. The driving motor 104 reversely rotates in accordance with a signal when the photo-electric element 131 turns on, so that the detection bracket 133 goes out from between the light-emitting device 130 of the upper home position sensor S1 and the photo-electric element 131. A position, in which the detection bracket 133 goes out from between the light-emitting device 130 of the upper home position sensor S1 and the photo-electric element 131, is denoted as a starting position (the home position) of the reference pin 36.

Next, the driving motor 122 of the width direction moving unit 39 shown in FIG. 6 is driven, and the urging pin 42 is moved via the moving member 114 to push a side edge of the plate 12, so that a side edge of the opposite side of the plate 12 bumps against the first reference pin 36A. Thus, the provisional positioning of the plate 12 is implemented. After the provisional positioning of the plate 12 is implemented, the urging pin 42 goes back as separating from the plate 12.

When the preset member 30 goes down from the upper of the plate feed guide unit 20, the plate feed rollers 24 and 28 convey the plate 12 forward so that the front edge of the plate 12 bumps against a pair of first positioning pins 52A at that time, the plate feed rollers 24 and 28 rotate and slip with the plate 12. Next, the urging pin 42 conveys the plate 12 in the right direction to bump against the first reference pin 36A, so that the regular positioning of the plate 12 is implemented in the state that the plate 12 is put on the plate feed guide 20. In this condition, the rotating drum 50 rotates to wind the plate 12 around the rotating drum 50, so that a movement of the exposure head 66 implements an image exposure.

Next, there will be explained an operation of positioning of a plate in the punch unit 16.

First, size information, such as length, width and thickness of the plate 12, is inputted by the size input means 160 into the control means 163. In case of the embodiments shown in FIG. 9 and FIG. 10, information is entered from the size input means 150 or the size and punch type input means 156 of the image exposure apparatus 10 to the control means 163. And thus there is no need of input operation of the size input means 160. The second reference pin 36B is moved by the migration length which is computed from the width size information of the plate 12 in accordance with the signals from the control means 163.

Next, the plate 12 is put on the guide plate 5 on a manual insertion basis so that the front edge of the plate 12 is in contact with the second positioning pins 52B, and the side edge is in contact with the second reference pin 36B. The first positioning pins 52A and the first reference pin 36A in the image exposure apparatus 10 are the same as the second positioning pins 52B and the second reference pin 36B in the punch unit 16 in relative position, respectively. Accordingly, the plate 12 is subjected to a three-point positioning at the same positions as the image exposure apparatus 10 in the punch unit 16. Next, the perforation is carried out using the puncher 46A or 46B selected by the punch type input means 161 or the size and punch type input means 156.

As mentioned above, according to a perforation and image exposure system of the present invention, even if it is concerned with a system in which an image exposure apparatus and a punch unit are independent of one another, a plate is subjected to positioning at the completely same positions in the image exposure apparatus and the punch unit. Accordingly, it is possible to perform positioning of plates with great accuracy in an image exposure apparatus and a punch unit with inexpensive means by the three-point positioning.

Although the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. A perforation and image exposure system comprising an image exposure apparatus for exposing an image into a plate, and a punch unit for forming on the plate punched holes for positioning, the perforation and image exposure system forming the plate having the punched holes for positioning and being exposed in the image, wherein the image exposure apparatus comprises:

a pair of first positioning pins which are in contact with a front edge of the plate;

a first reference pin for defining a lateral position of the plate through contacting with one side edge of the plate contacting the pair of first positioning pins; and image exposure means for exposing the image into the plate subjected to positioning by the pair of first positioning pins and the first reference pin, wherein the punch unit comprises:

a pair of second positioning pins which are in contact with the front edge of the plate;

a second reference pin for defining a lateral position of the plate through contacting with one side edge of the plate contacting the pair of second positioning pins; and perforation means for forming punched holes for positioning on the plate subjected to positioning by the pair of second positioning pins and the second reference pin, and wherein when the image exposure apparatus and the punch unit perform positioning for the same plate, the image exposure apparatus and the punch unit keep relative positions of three pins of the pair of first positioning pins and the first reference pin and relative positions of three pins of the pair of second positioning pins and the second reference pin at same positions.

2. A perforation and image exposure system according to claim 1, wherein the first reference pin and the second reference pin are movable in a same direction as a direction coupling the pair of first positioning pins with one another and in a same direction as a direction coupling the pair of second positioning pins with one another, respectively, and wherein when the image exposure apparatus and the punch unit perform positioning for the same plate, the image exposure apparatus and the punch unit further comprise first reference pin position control means and second reference pin position control means, respectively, the first reference pin position control means and the second reference pin position control means moving the first reference pin and the second reference pin to positions in which relative positions of the first reference pin and the second reference pin to the pair of first positioning pins and the pair of second positioning pins are same, respectively.

3. A perforation and image exposure system according to claim 2, wherein one of the image exposure apparatus and the punch unit has information input means for entering size information of the plate, and information transmitting means for transmitting information entered from the information input means to another apparatus or unit, and the another apparatus or unit has information receiving means for receiving information transmitted from the one apparatus or unit, the reference pin position control means provided on the one apparatus or unit controls a position of the reference pin provided on the one apparatus or unit in accordance with the information entered from the information input means, and the reference pin position control means provided on the another apparatus or unit controls a position of the reference pin provided on the another apparatus or unit in accordance with the size information of the plate received by the information receiving means.

4. A perforation and image exposure system according to claim 3, wherein the one apparatus or unit is the image exposure apparatus, the information input means enters punch type information as well as the size information, and the perforation means forms the punched holes in accordance with the punch type information received by the information receiving means.

5. A perforation and image exposure system according to claim 1, wherein the punch unit has punch type input means for entering punch type information, and the perforation means forms the punched holes in accordance with the punch type information entered from the punch type input means.

6. A perforation and image exposure system according to claim 1, wherein the image exposure apparatus has a plate guide unit, which incorporates therein a plate feed roller for conveying the plate to the first positioning pins by means of rotating while a lower surface of the plate is supported, the plate feed roller rotating below the plate at a position in which a front edge of the plate is in contact with the first positioning pins, the first reference pin, and a width direction moving unit having an urging pin urging the plate to the first reference pin through conveying the plate to the first reference pin.

7. A perforation and image exposure system according to claim 1, wherein the image exposure apparatus has a rotating drum around which the plate is wound, and an exposure head for exposing an image into the plate wound around the rotating drum, and the first positioning pins are provided on a peripheral surface of the rotating drum.

* * * * *